United States Patent
Wang

(10) Patent No.: US 6,193,205 B1
(45) Date of Patent: Feb. 27, 2001

(54) RETAINER FOR A BGA FAN

(75) Inventor: Michael Wang, Taipei Hsien (TW)

(73) Assignee: Tennmax Trading Corp., Taipei Hsien (TW)

( * ) Notice: Subject to any disclaimer, the term of this patent is extended or adjusted under 35 U.S.C. 154(b) by 0 days.

(21) Appl. No.: 09/304,177

(22) Filed: May 3, 1999

(51) Int. Cl.$^7$ ................................................ A47B 97/00
(52) U.S. Cl. ........................ 248/510; 248/694; 361/710
(58) Field of Search ........................... 248/694, 316.7, 248/500, 510, 672, 675, 680, 681; 361/707, 697, 704, 710; 257/718, 719; 174/16.3; 165/80.2, 80.3, 80.4

(56) References Cited

U.S. PATENT DOCUMENTS

| | | | |
|---|---|---|---|
| 4,716,494 | * 12/1987 | Bright et al. | 361/386 |
| 5,353,863 | * 10/1994 | Yu | 165/80.3 |
| 5,436,798 | * 7/1995 | Wieland, Jr. | 361/710 |
| 5,493,475 | * 2/1996 | Lin | 361/710 |
| 5,676,199 | * 10/1997 | Lee | 165/80.3 |

* cited by examiner

Primary Examiner—Leslie A. Braun
Assistant Examiner—Gwendolyn Baxter
(74) Attorney, Agent, or Firm—William E. Pelton

(57) ABSTRACT

A retainer for a ball grid array (BGA) fan is disclosed. The retainer has a pair of oppositely mated frame members each having a first flange, a second flange parallel to the first flange and extending from an inner face thereof and a space defined between the first and the second flanges for receiving the substrate therein; and means for engaging the fan with the mated frame members after the substrate is received between the opposite spaces.

2 Claims, 6 Drawing Sheets

RETAINER FOR A BGA FAN

BACKGROUND OF THE INVENTION

1. Field of the Invention

The present invention relates to a retainer for a ball grid array (BGA) fan, and more particularly to a BGA fan retainer which requires no predetermined space on a substrate to mount the fan thereon, such that an operator is able to easily mount the BGA fan in a compact space.

2. Description of Related Art

A conventional method of mounting a BGA fan is shown in FIG. 7. A substrate (90) provided with a centrally located die (91) has a plurality of bonding wires (92) which are provided to electrically connect the die (91) to the circuit on the substrate (90). A plastic cover (93) is then formed over the die (91) to complete the packaging. Furthermore, a plurality of solder balls (94) arranged in a matrix form are formed on the bottom of the substrate (90) to electrically connect the die and bonding wires to a mother board, interface card or other electrical device. As with ordinary integrated circuits, a fan (95) is mounted on top of the cover (93) to dissipate excess heat generated by the packaged integrated circuit chip. Normally, the the fan (95) is glued to the cover (93). However, a simple glued connection between the fan (95) and the cover (93) will withstand a shock or vibration test required before the product shipped to the market.

To overcome this defect, a modified fan (80), as shown in FIG. 8, has a pair of extensions (82) (only one is shown) diagonally formed on the bottom thereof, such that the fan (80) is able to be securely mounted on a mother board (98) by means of a bolt and a nut. Although, the fan (80) is able to be fixed on the mother board (98), an additional predetermined space must be left for mounting the fan, which can be a difficult thing to do, especially on a printed circuit board (PCB).

The present invention aims to provide an improved retainer for a BGA fan to overcome the aforementioned problems.

SUMMARY OF THE INVENTION

The main object of the present invention is to provide a retainer for a BGA fan. The retainer has means for respectively fixing a pair of frame members as well as a fan securely on a substrate. The means comprise a pair of hooks each having at least one finger, at least one snap plate and an abutting foot. In order to accomplish the aforementioned objective, the frame members, which are able to secure the substrate therebetween, each has a first flange and a second flange parallel to the first flange and the space therebetween is equal to the thickness of the substrate, such that an end face of the substrate is able to be inserted into the space and thus be held therein. The abutting foot of the hook is able to securely engage the bottom face of the frame member after the finger extends into the lowest gap in the fan. Thereafter, the fan securely engaged between the pair of frame members can be securely fixed on the substrate without any additional space reserved on the substrate.

The detailed features of the present invention will be apparent after reading the following detailed description with appropriate reference to the accompanying drawings.

DETAILED DESCRIPTION OF PREFERRED EMBODIMENT

Figure 1:
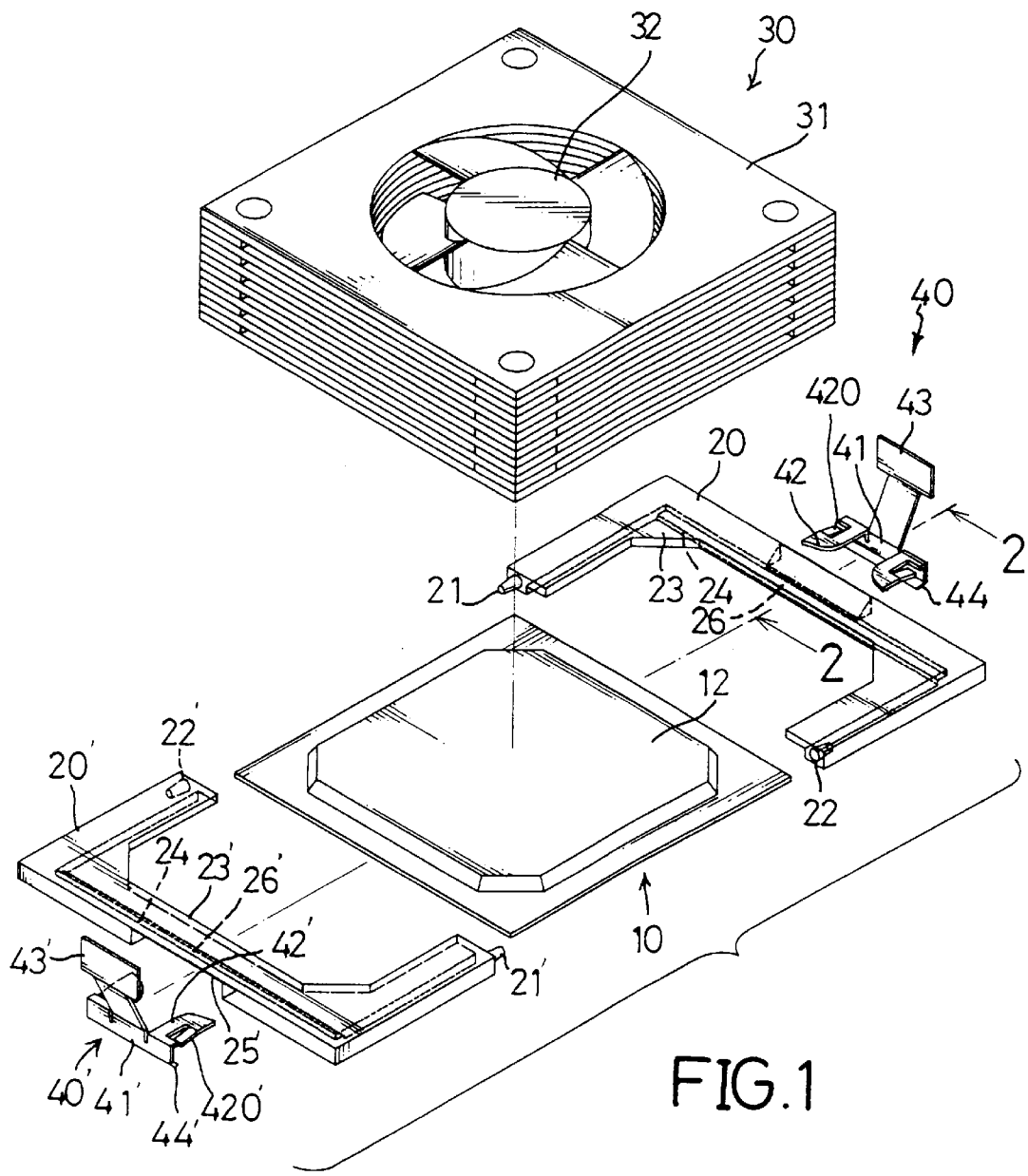
FIG. 1 is an exploded perspective view of a retainer in accordance with the present invention, wherein a fan co-operating with the retainer is also shown in the drawing.
Figure 2:
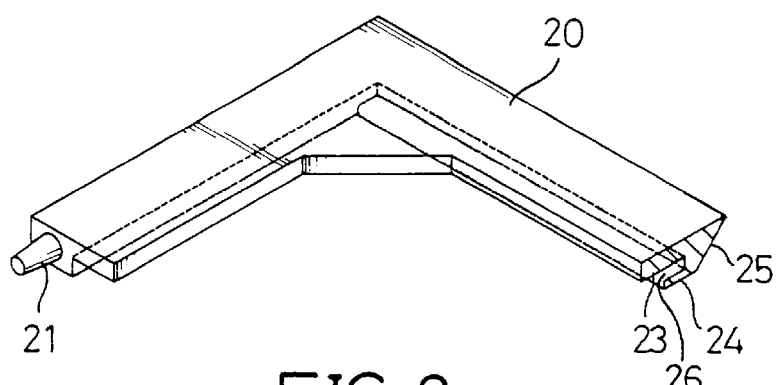
FIG. 2 is a perspective view of a frame member of the retainer of FIG. 1, wherein a portion of the frame member is in cross section.

As shown in FIGS. 1 and 2, a retainer constructed in accordance with the present invention comprises a pair of substantially U-shaped frame members (20, 20') and means for respectively engaging the frame members (20, 20') to a substrate (10) having a package body (12) thereon. Each of the frame member (20, 20') is identical to the other, such that a detailed description will be given to only one of them. The frame member (20) has a first flange (23), a second flange (24) parallel to the first flange (23) and formed on the inner face thereof and a cutout (25) centrally defined in the outside face opposite to the inner face having the first and the second flanges (23, 24) and being inclined with respect to both the first and second flanges (23, 24). A space (26) between the first and the second flanges (23, 24) has a thickness the same as that of the substrate (10), such that a portion of the substrate (10) is able to be received in the space (26) and held between the first and second flanges (23, 24). A first distal end of the frame member (20) has a protrusion (21) extending out therefrom and the second distal end has a slot (22) defined to correspond to the protrusion (21') of the other frame member (20'). When the two frame members (20, 20') are mated with each other by the insertion of the protrusions (21, 21') into the corresponding slots (22, 22'), the substrate (10) is securely held between the opposite spaces (26, 26'). The means for respectively engaging the frame members (20, 20') to the substrate (10) comprises a pair of identical hooks (40). The hook (40) has at least one finger (42) perpendicularly extending from a base plate (41), at least one snap plate (420) integrally formed with the finger (42), an abutting foot (44) downwardly inclined with respect to the base plate (41) and a handle (43) upwardly inclined with respect to the base plate (41).

Figure 3:
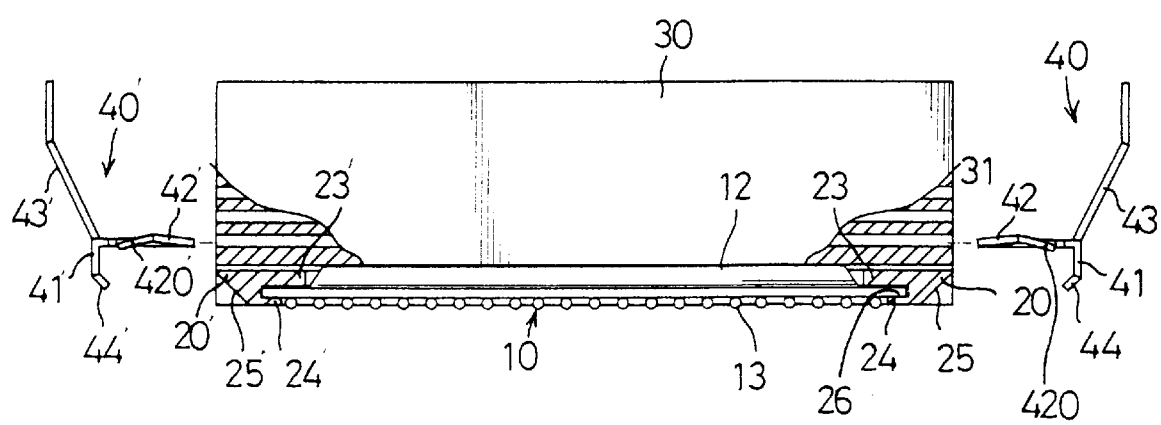
FIG. 3 is a side view in partial cross section showing the engagement between the frame member and the substrate.
Figure 4:
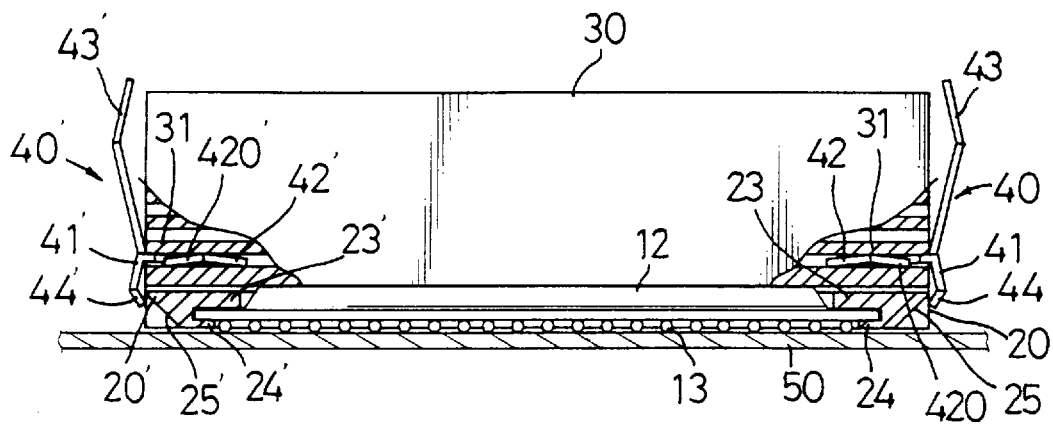
FIG. 4 is a side view in partial cross section showing the cooperation of the frame members with the hooks.
Figure 5:
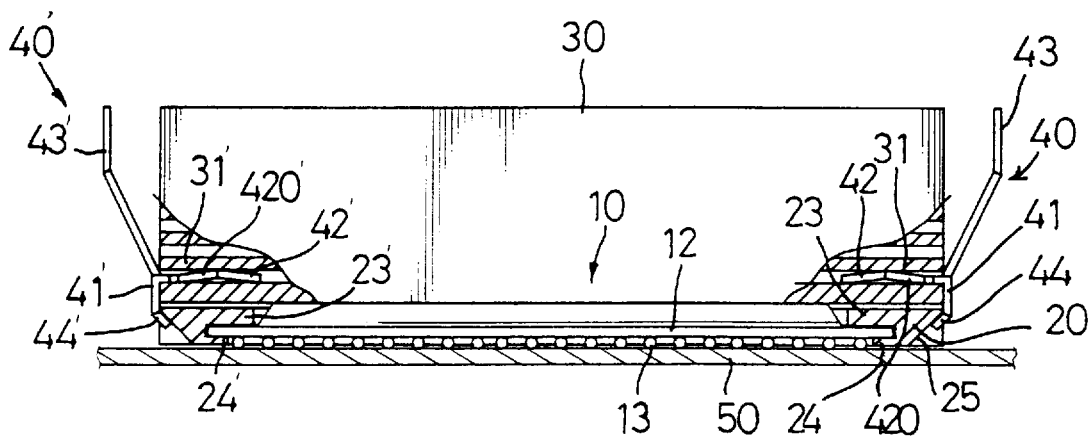
FIG. 5 is a side view in partial cross section showing the engagement between the hooks, and the frame members.

Referring to FIGS. 3, 4 and 5, to allow the substrate (10) to be received in the space (26), not only is the thickness of the space (26) equal to the thickness of the substrate (10), but also the thickness of the second flange (24) is no greater than the diameter of the solder ball (13) under the substrate (10). Furthermore, referring back to FIG. 1, the fan (30) having a centrally located fan blade (32) therein is composed of multiple mutually superposed heat dissipating plates (31). Thus, in order to have a good heat dissipation effect, gaps are defined between adjacent heat dissipating plates (31).

As stated, when the substrate (10) is securely received between the spaces (26, 26') of the mated frame members (20, 20'), the fan (30) is placed on top of the package body (12) and the fingers (42) are respectively inserted into the lowest gap of the fan (30).

After the fingers (42) are inserted into the gap, the user is able to hold the handle (43) and press it downward to have the abutting foot (44) engage with a face defining the cutout (25). Due to the snap plate (420), the hook (40) has a clearance to bend downward after the finger (42) is inserted into the gap of the fan (30), such that the hook (40) is able to securely hold the fan (30) on the frame member (20).

Figure 6:
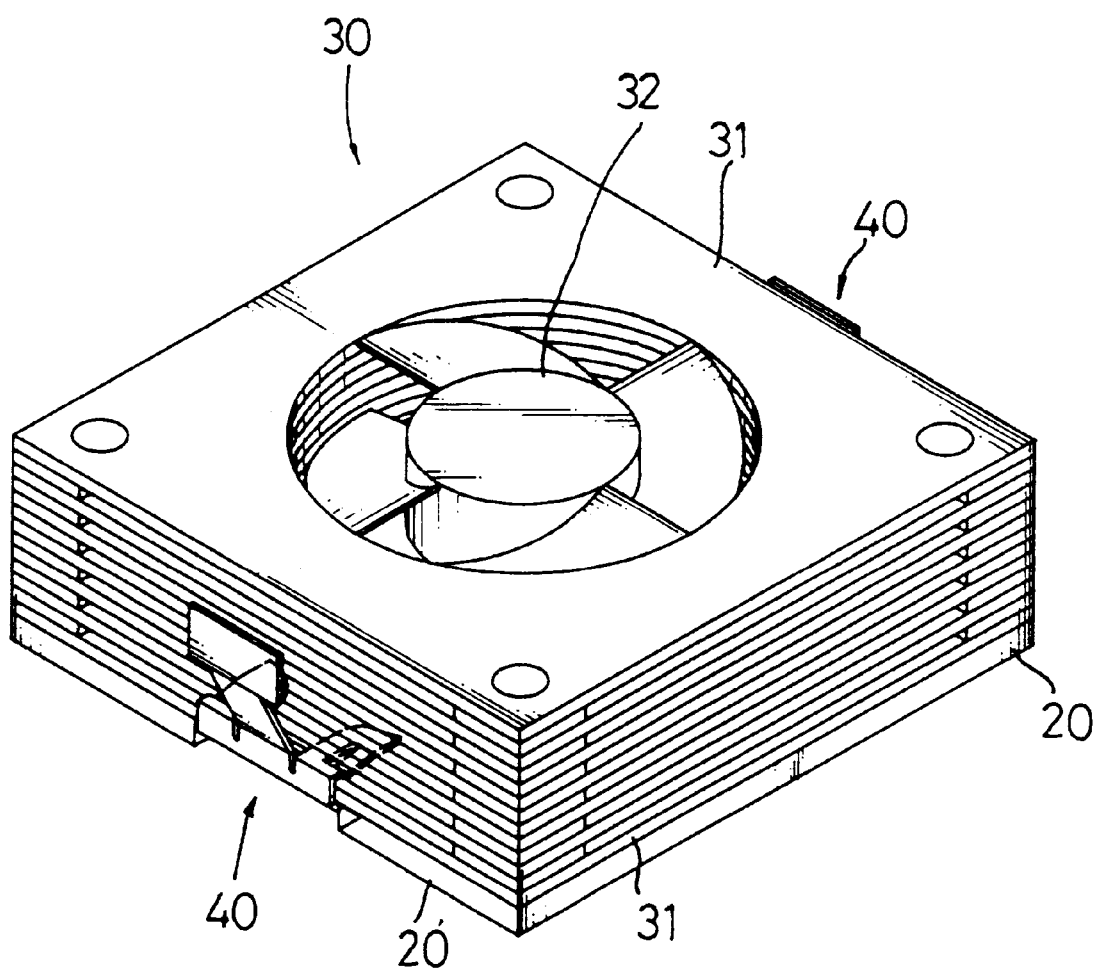
FIG. 6 is a perspective view showing the application of the retainer of the invention to the fan.
Figure 7:
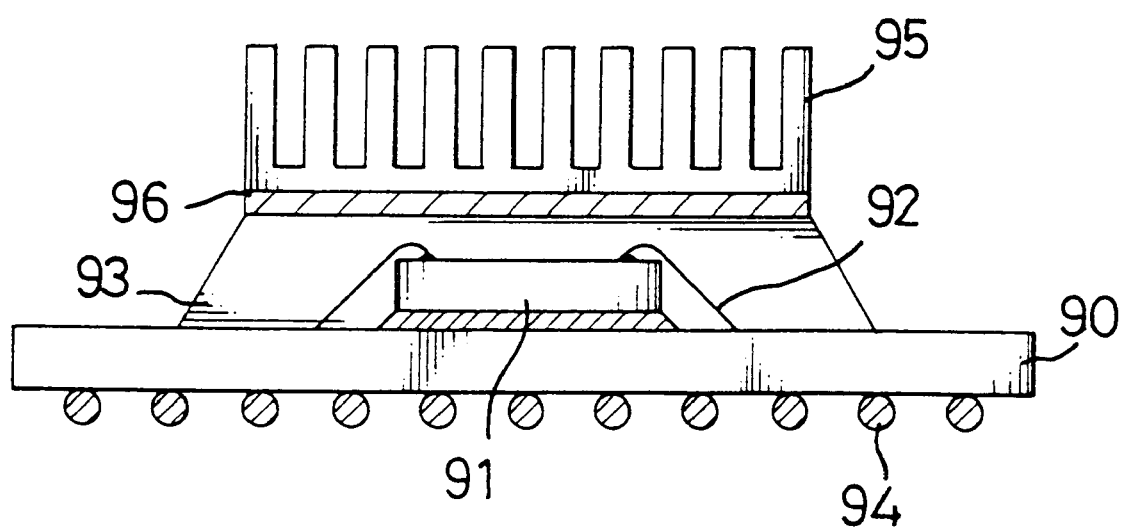
FIG. 7 is a side view showing the conventional method of bonding a packaged integrated circuit chip with a fan.
Figure 8:
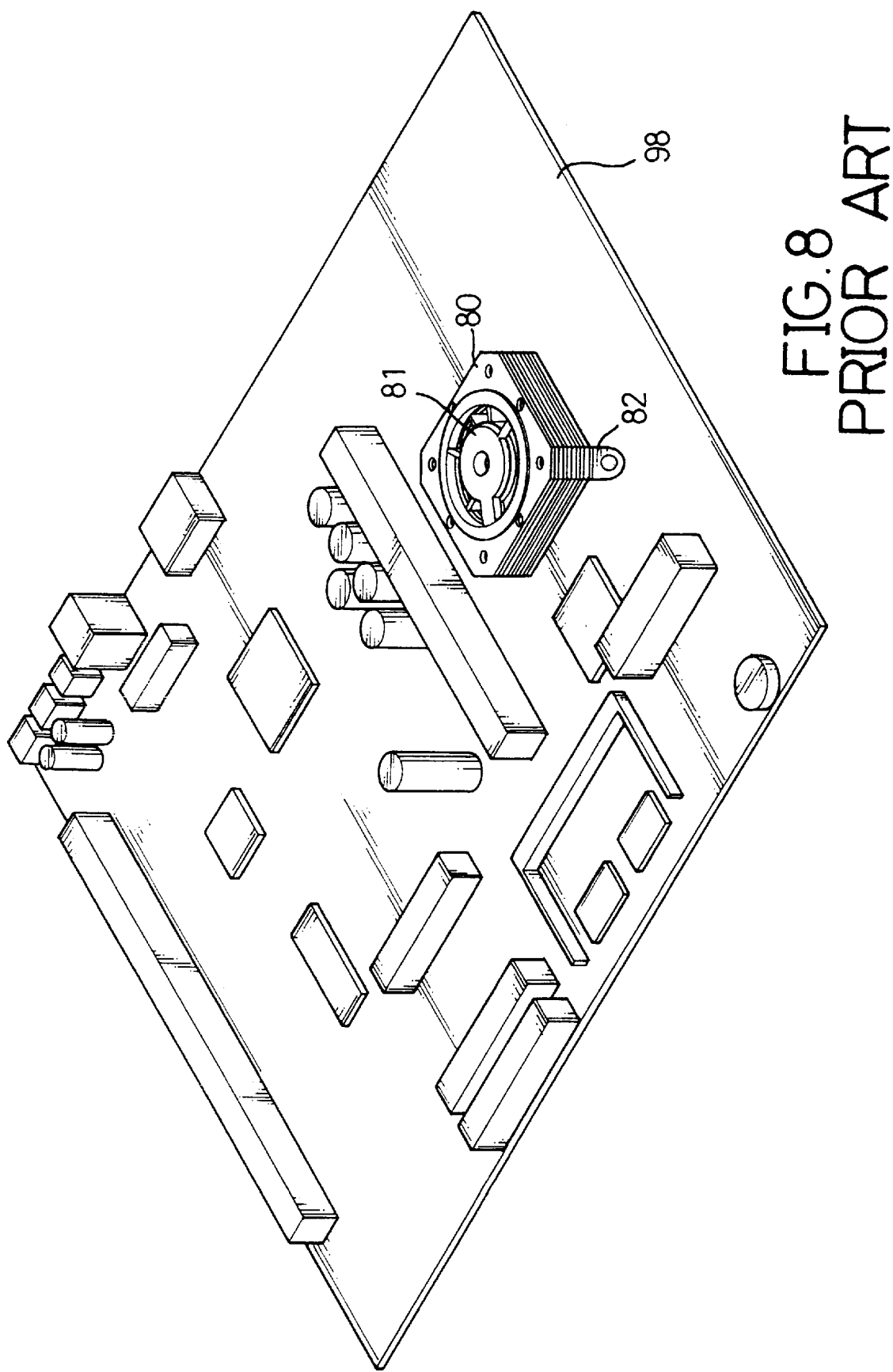
FIG. 8 is a perspective view showing another conventional way of mounting a fan on a motherboard.

It is noted form FIG. 6 that the substrate (10) is firmly mounted on the printed circuit board (PCB) by the solder balls (13). Therefore, because of the diameter of the solder ball (13) and the thickness of the second flange (24), opposite sides of the substrate (10) are able to be received in the spaces (26, 26') of the mated frame members (20, 20'). Thereafter, the hooks (40, 40') are then able to secure the fan (30) to the frame members (20, 20').

What is claimed is:

1. A retainer for a BGA fan having a plurality of heat dissipating plates mutually superposed with one another and defining a gap between adjacent heat dissipating plates, the retainer comprising:

a pair of mated frame members each having a first flange, a second flange parallel to the first flange and extending from an inner face thereof with a space defined between said flanges for receiving a substrate therein, and a cutout having a face portion; and a pair of hooks to secure the fan to the frame members each of said hooks comprising a base plate with at least one finger projecting therefrom, at least one snap plate integrally formed with said finger, an abutting foot downwardly inclined with respect to the base plate and a handle upwardly inclined with respect to the base plate, said finger being adapted to be inserted into one of the gaps defined by the fan such that said abutting foot abuts said face portion of said cutout thereby to secure said frame members together and the fan to said frame members.

2. The retainer as claimed in claim 1, wherein the cutout in each of said frame members is centrally defined in an outside face opposite to an inner face having the first and the second flanges and is inclined with respect to both the first and second flanges.

* * * * *